(12) United States Patent
Han et al.

(10) Patent No.: US 10,719,172 B2
(45) Date of Patent: Jul. 21, 2020

(54) DISPLAY DEVICE WITH BUILT-IN OPTICAL IMAGE SENSOR

(71) Applicant: LG Display Co., Ltd., Seoul (KR)

(72) Inventors: ManHyeop Han, Paju-si (KR); KyoSeop Choo, Paju-si (KR); BuYeol Lee, Paju-si (KR); SeungMan Ryu, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/453,890

(22) Filed: Jun. 26, 2019

(65) Prior Publication Data
US 2020/0004381 A1 Jan. 2, 2020

(30) Foreign Application Priority Data
Jun. 27, 2018 (KR) .................. 10-2018-0074067

(51) Int. Cl.
| | | |
|---|---|---|
| *G06F 3/042* | (2006.01) | |
| *G06F 3/041* | (2006.01) | |
| *H01L 27/32* | (2006.01) | |
| *H01L 51/00* | (2006.01) | |
| *H01L 51/52* | (2006.01) | |

(52) U.S. Cl.
CPC .......... *G06F 3/0425* (2013.01); *G06F 3/0412* (2013.01); *H01L 27/323* (2013.01); *H01L 27/3234* (2013.01); *H01L 27/3246* (2013.01); *H01L 27/3262* (2013.01); *H01L 27/3272* (2013.01); *H01L 51/0097* (2013.01); *H01L 51/5253* (2013.01); *G06F 2203/04106* (2013.01); *G06F 2203/04107* (2013.01); *G06F 2203/04111* (2013.01); *G06F 2203/04112* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 2018/0046837 A1* | 2/2018 | Gozzini | ............... G01N 21/894 |
| 2018/0225498 A1* | 8/2018 | Setlak | ................ G06K 9/00026 |
| 2019/0147213 A1* | 5/2019 | Yeke Yazdandoost | ...................... G06K 9/00013 |
| 2019/0362120 A1* | 11/2019 | Yeke Yazdandoost | ...................... G06K 9/00013 |

\* cited by examiner

*Primary Examiner* — Aneeta Yodichkas
(74) *Attorney, Agent, or Firm* — Fenwick & West LLP (57) ABSTRACT

A display device with a built-in optical image sensor includes a display panel, a cover substrate, and an optical image sensor. The cover substrate has light transmissivity and covers the display panel. The optical image sensor is coupled to the display panel and senses an image of a body of a user using light reflected from the body of the user in contact with the cover substrate. The display panel includes a base substrate, a pixel portion, an encapsulation film, and a touch sensing layer. The touch sensing layer includes the touch electrode portion and is disposed on the encapsulation film covering a pixel portion. A plurality of pinholes are defined in at least one layer having light absorptivity or light reflectivity of the pixel portion. The plurality of pinholes overlap the optical image sensor. Further, openings overlapping the plurality of pinholes are defined in the touch electrode portion.

16 Claims, 6 Drawing Sheets

DISPLAY DEVICE WITH BUILT-IN OPTICAL IMAGE SENSOR

CROSS-REFERENCE(S) TO RELATED APPLICATIONS

This application claims priority to Republic of Korea Patent Application No. 10-2018-0074067, filed on Jun. 27, 2018 in the Korean Intellectual Property Office, the disclosure of which is incorporated herein by reference in its entirety.

BACKGROUND OF THE INVENTION

Field of the Invention

Exemplary embodiments of the present disclosure relate to a display device with a built-in optical image sensor, which has an optical image sensor for recognizing a bio-image including a fingerprint and a face of human.

Description of the Related Art

As portable information processing devices such as notebook computers, tablet computers, and smart phones are developed, users can handle various tasks using the portable information processing devices.

Meanwhile, since these portable information processing devices have the risk of being lost, methods for improving security of the portable information processing devices have been studied so as to prevent users other than owners of the portable information processing devices from operating the portable information processing devices. For example, a smartphone with improved security using biometric information such as a fingerprint or a face of a user has been developed.

Meanwhile, an optical image sensor may be provided in the smartphone. As accuracy of the optical image sensor for recognizing a fingerprint or a face of a user is improved, security of the smartphone can be improved, the number of times of re-recognizing the user's biometric information is reduced, and the user convenience may be improved.

SUMMARY OF THE INVENTION

An object of the present disclosure is to provide a display device with a built-in optical image sensor having improved accuracy for recognizing biometric information of a user.

Other objects and advantages of the present disclosure can be understood by the following description and become apparent with reference to the embodiments of the present disclosure. Also, it is obvious to those skilled in the art to which the present disclosure pertains that the objects and advantages of the present disclosure can be realized by the means as claimed and combinations thereof.

Provided herein is a display device with a built-in optical image sensor, which includes a display panel, a cover substrate, and an optical image sensor.

The display panel may display an image. The cover substrate may have light transmissivity and cover the display panel. The optical image sensor may be coupled to the display panel, and the optical image sensor may sense an image of a body of a user using light reflected from the body of the user in contact with the cover substrate.

The display panel may include a base substrate, a pixel portion, an encapsulation film, and a touch sensing layer. The pixel portion may be disposed on the base substrate. The encapsulation film may cover the pixel portion. The touch sensing layer may include a touch electrode portion and be disposed on the encapsulation film to be located between the encapsulation film and the cover substrate.

A plurality of pinholes may be defined in at least one layer having light absorptivity or light reflectivity of the pixel portion. The plurality of pinholes may overlap the optical image sensor. Further, a plurality of openings overlapping the plurality of pinholes may be defined in the touch electrode portion.

In one embodiment of the present disclosure, the pixel portion may include a plurality of pixels disposed on the base substrate, and a bank layer located between two adjacent pixels among the plurality of pixels. The bank layer may have light absorptivity, and the plurality of pinholes may be defined in the bank layer.

In one embodiment of the present disclosure, each of the plurality of pinholes may be defined as a shape passing through the bank layer in a thickness direction of the base substrate.

In one embodiment of the present disclosure, the pixel portion may include the plurality of pixels disposed on the base substrate. Each of the plurality of pixels may include a driving transistor disposed on the base substrate, an anode electrically connected to the driving transistor, an organic light emitting layer disposed on the anode, a cathode disposed on the organic light emitting layer, and a light shielding layer interposed between the base substrate and the driving transistor and configured to block light traveling toward the driving transistor. At least one among the plurality of pinholes may be defined in the light shielding layer.

Further, the plurality of pixels may be disposed in a plurality of pixel areas, a non-pixel area may be defined between two adjacent pixel areas among the plurality of pixel areas, and the plurality of pinholes may be defined in the light shielding layer at positions corresponding to the non-pixel area.

In one embodiment of the present disclosure, the pixel portion may include a bank layer located between two adjacent pixels among the plurality of pixels. The bank layer may have light transmissivity.

In one embodiment of the present disclosure, the pixel portion may include a plurality of pixels disposed on the base substrate. Each of the plurality of pixels may include a driving transistor disposed on the base substrate, an anode having light reflectivity and electrically coupled to the driving transistor, an organic light emitting layer disposed on the anode, and a cathode disposed on the organic light emitting layer. At least one among the plurality of pinholes may be defined in the anode.

In one embodiment of the present disclosure, the plurality of pixels may be disposed in a plurality of pixel areas, a non-pixel area may be defined between two adjacent pixel areas among the plurality of pixel areas, and at least one of the plurality of pinholes may be defined in the anode at a position corresponding to the non-pixel area.

In one embodiment of the present disclosure, the touch electrode portion may include a touch electrode, and a bridge configured to connect the touch electrode to another touch electrode adjacent to the touch electrode. The plurality of openings may be defined in the touch electrode.

In one embodiment of the present disclosure, the touch electrode may have a characteristic of light reflectivity.

In one embodiment of the present disclosure, the touch electrode portion may include a touch electrode with a mesh structure, and each of the plurality of openings may be defined as a shape in which a portion of the touch electrode is disconnected.

In one embodiment of the present disclosure, the optical image sensor may be opposite to the pixel portion by interposing the base substrate therebetween.

In one embodiment of the present disclosure, the plurality of pinholes may be disposed in a form of a matrix having a row direction and a column direction.

In one embodiment of the present disclosure, the touch sensing layer may be disposed on the encapsulation film to be brought into contact therewith.

In one embodiment of the present disclosure, each of the plurality of openings may overlap any one among the plurality of pinholes.

BRIEF DESCRIPTION OF THE DRAWINGS

The above and other objects, features and other advantages of the present disclosure will be more clearly understood from the following detailed description taken in conjunction with the accompanying drawings, in which.

DESCRIPTION OF SPECIFIC EMBODIMENTS

Hereinafter, embodiments of the present disclosure will be described in detail with reference to the accompanying drawings. The above objects, features, and advantages of the present disclosure will be understood through the following embodiments with reference to the accompanying drawings. However, the present disclosure is not limited to the embodiments disclosed herein and may be modified in various forms. The embodiments of the present disclosure, which will be described, are provided to clarify the technical spirit of the present disclosure and also to fully transfer the technical spirit thereof to those skilled in the art to which the present disclosure pertains. Therefore, the scope of the present disclosure should not be construed as being limited to embodiments which will be described below. In the following embodiments and the drawings, the same reference numerals denote the same components.

Further, throughout this disclosure, terms such as a "first," "second," and the like are used not for limitative but for the purpose of distinguishing one component from another component. Further, when a portion of a film, a region, a component, or the like is referred to as being "on" another portion, this includes not only a case in which the portion is "directly on" another portion but also a case in which another film, another region, another component, or the like is interposed between the portion and another portion.

Figure 1:
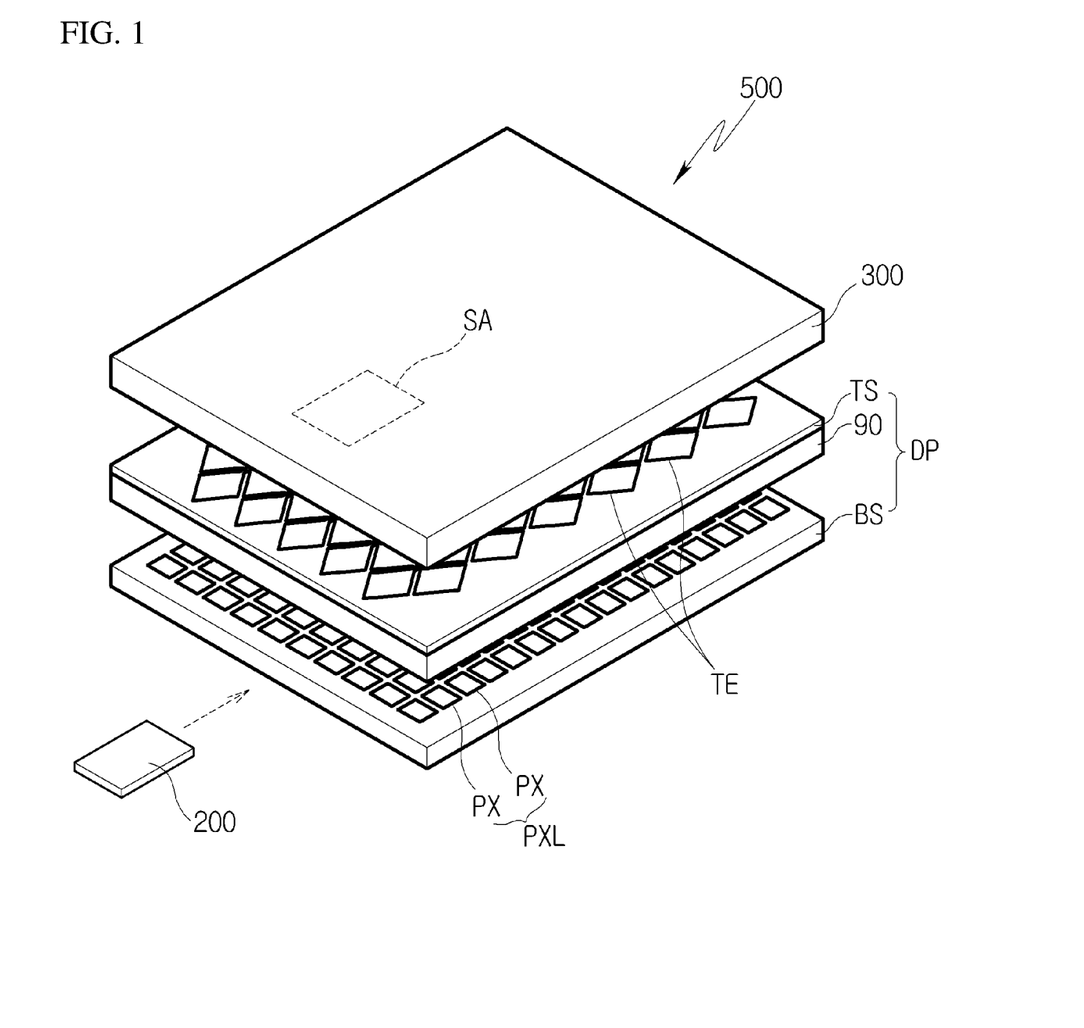
FIG. 1 is an exploded perspective view of a display device with a built-in optical image sensor according to an embodiment of the present disclosure.

FIG. 1 is an exploded perspective view of a display device 500 with a built-in optical image sensor according to an embodiment of the present disclosure.

Referring to FIG. 1, the display device 500 with a built-in optical image sensor (hereinafter, referred to as a "display device 500") includes a display panel DP, an optical image sensor 200, and a cover substrate 300.

In this embodiment, the display panel DP may be an organic electroluminescent display panel. The display panel DP may include a base substrate BS, a pixel portion PXL, an encapsulation film 90, and a touch sensing layer TS.

In this embodiment, the base substrate BS may be a plastic substrate. More specifically, the base substrate BS may include a flexible polyimide (PI) film. In order to complement strength of the base substrate BS implemented with the PI film, the base substrate BS may further include a polyethylene terephthalate (PET) substrate which is bonded to the back surface of the PI film.

Alternatively, the base substrate BS may be a glass substrate or a metal substrate.

The pixel portion PXL is disposed on the base substrate BS. The pixel portion PXL may include a plurality of pixels PX disposed in a column direction and a row direction. As in the present embodiment, when the display panel DP is an organic electroluminescent display panel, each of the plurality of pixels PX may include an organic light emitting diode, and the display panel DP may display an image using light emitted from the plurality of pixels PX.

The encapsulation film 90 covers the pixel portion PXL. The encapsulation film 90 blocks moisture or gas from flowing into the pixel portion PXL from the outside. In the present embodiment, the encapsulation film 90 may be an organic film and block moisture or gas from flowing into the pixel portion PXL together with a sub-encapsulation film 80 of FIG. 4 implemented with an inorganic film.

The touch sensing layer TS senses a contact position of a user, which is generated on the cover substrate 300.

In the present embodiment, the touch sensing layer TS is disposed on the encapsulation film 90. More particularly, the touch sensing layer TS is disposed on the encapsulation film 90 to be brought into contact therewith. Consequently, the display panel DP having a so-called touch on encapsulation (TOE) structure in which the touch sensing layer TS is embedded in the display panel DP may be implemented.

The touch sensing layer TS includes a touch electrode portion TE, and the touch electrode portion TE overlaps the pixel portion PXL. In the present embodiment, in order to reduce parasitic capacitance generated between the touch electrode portion TE and an electrode such as an anode or a cathode disposed in each of the plurality of pixels PX, a material constituting the touch electrode portion TE may include a metal material instead of a transparent conductive material such as indium tin oxide (ITO) or indium zinc oxide (IZO) such that the touch electrode portion TE may have light reflectivity and opacity.

The cover substrate 300 covers the display panel DP. In the present embodiment, the cover substrate 300 may be a tempered glass substrate or a plastic substrate. The cover substrate 300 may be disposed in an outermost side of the display device 500 to serve as a window. The cover substrate 300 may protect the display panel DP and the touch sensing layer TS.

Although not shown in the drawing, a deco layer (not shown) which is spaced apart from the pixel portion PXL when viewed in plan view may be disposed on the cover substrate 300. The decor layer may include a pattern representing a logo, a trademark, or a phrase for identifying the display device 500.

The optical image sensor 200 is coupled to the display panel DP. In the present embodiment, the optical image sensor 200 may be disposed on a rear surface of the display panel DP to correspond to a sensing area SA defined in the cover substrate 300. The optical image sensor 200 may be opposite to the pixel portion PXL by interposing the base substrate BS therebetween.

The optical image sensor 200 senses a bio-image of the user such as a fingerprint in contact with the sensing area SA of the cover substrate 300. As in the present embodiment, when the display panel DP is an organic electroluminescent display panel, light which is emitted from the plurality of pixels PX and then reflected from the fingerprint of the user in contact with the cover substrate 300 is incident on the optical image sensor 200, and then the optical image sensor 200 generates an image of the fingerprint of the user using the incident light.

In the present embodiment, the optical image sensor 200 may be modularized separately from the display panel DP to be coupled to the rear surface of the display panel DP. Alternatively, the optical image sensor 200 may be embedded in the display panel DP to be implemented in a single module with the display panel DP.

As described above, in the present embodiment, the light incident on the optical image sensor 200 is emitted from the plurality of pixels PX, but alternatively, the light incident on the optical image sensor 200 may be emitted from a separate light source. In this case, in order to prevent degradation in display quality of the display panel DP due to a mixture of the light emitted from the separate light source with the light emitted from the plurality of pixels PX, the separate light source may emit infrared light.

Figure 2:
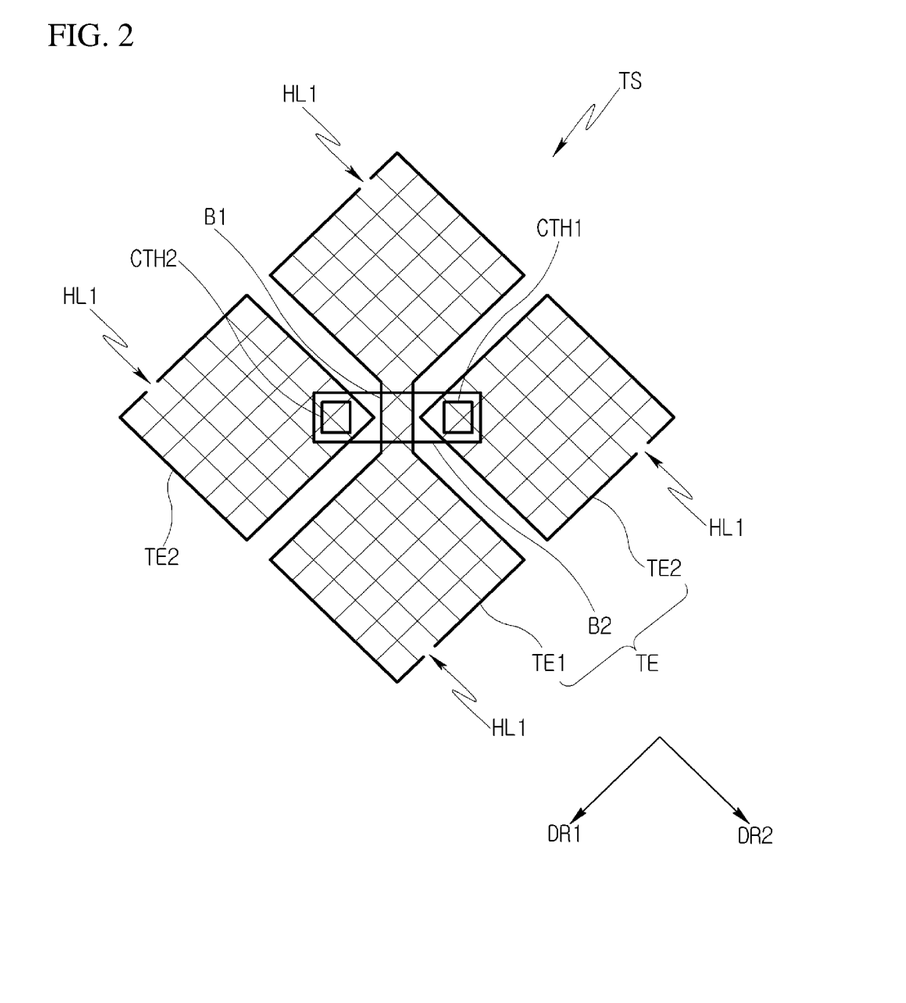
FIG. 2 is an enlarged plan view of a portion of a touch electrode portion of a touch sensing layer shown in FIG. 1.

FIG. 2 is an enlarged plan view of a portion of the touch electrode portion TE of the touch sensing layer TS shown in FIG. 1.

Referring to FIG. 2, the touch sensing layer TS is disposed on the encapsulation film 90 and embedded in the display panel DP. The touch sensing layer TS includes the touch electrode portion TE.

The touch sensing layer TS senses a position of a finger or a touch pen which is brought into contact with the cover substrate 300 of FIG. 1. In the present embodiment, the touch sensing layer TS may sense a touch position by determining a variance in capacitance generated in the touch electrode portion TE in response to a touch which is generated on the cover substrate 300.

In the present embodiment, the touch electrode portion TE includes a plurality of first touch electrodes TE1, a plurality of second touch electrodes TE2, a first bridge B1, and a second bridge B2. In the present embodiment, materials constituting the plurality of first touch electrodes TE1 and the plurality of second touch electrodes TE2 may each include a metal material.

In the present embodiment, the plurality of first touch electrodes TE1 and the plurality of second touch electrodes TE2 may each have a mesh-shaped structure. For example, a portion extending in a first direction DR1 and a portion extending in a second direction DR2 perpendicular to the first direction DR1 of each of the plurality of first touch electrodes TE1 are connected in a lattice structure.

The plurality of first touch electrodes TE1 are disposed on the encapsulation film 90 of FIG. 1 in one direction. Two adjacent first touch electrodes TE1 are directly connected via the first bridge B1.

Figure 4:
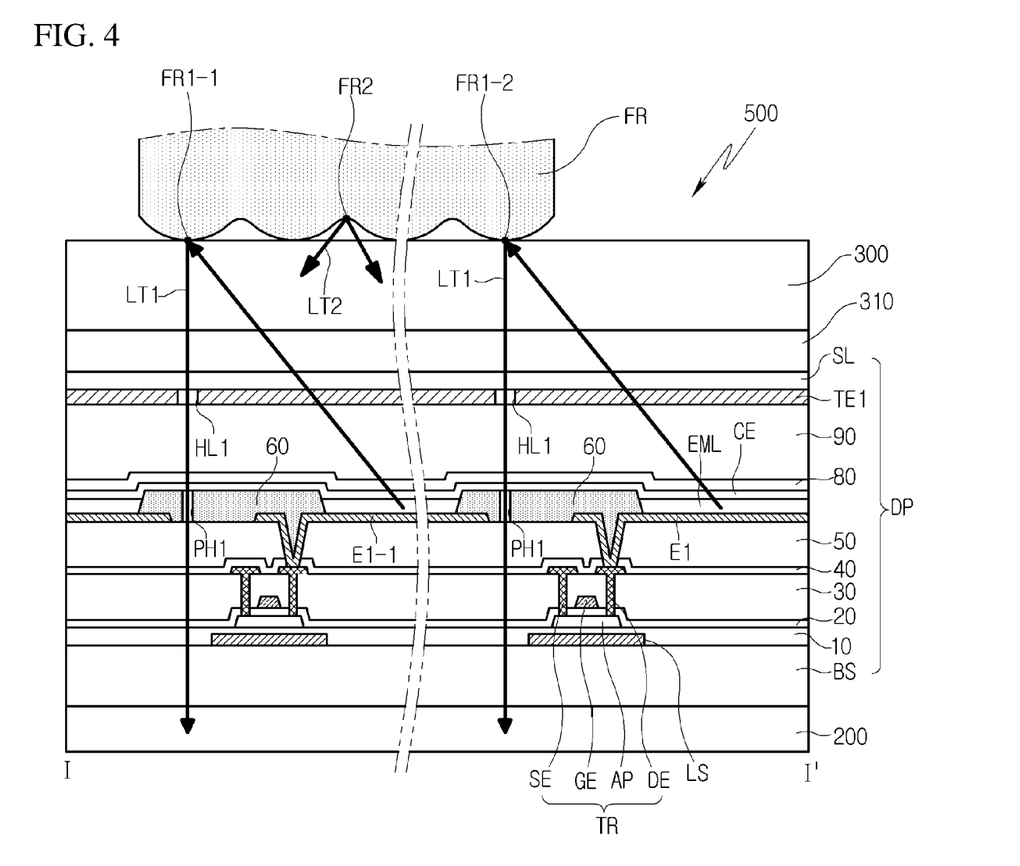
FIG. 4 is a cross-sectional view taken along line I-I' of FIG. 3.

The plurality of first touch electrodes TE1 are covered by an interlayer insulating film SL of FIG. 4, and the plurality of second touch electrodes TE2 are disposed on the interlayer insulating film SL. Further, the plurality of second touch electrodes TE2 are disposed in a direction intersecting the direction in which the plurality of first touch electrodes TE1 are disposed.

As described above, the interlayer insulating film SL is disposed between the plurality of first touch electrodes TE1 and the plurality of second touch electrodes TE2 such that two adjacent second touch electrodes TE2 are connected via the second bridge B2. More specifically, a first contact hole CTH1 passing through the interlayer insulating film SL is defined to correspond to one end portion of the second bridge B2, and a second contact hole CTH2 passing through the interlayer insulating film SL is defined to correspond to the other end portion of the second bridge B2. The second bridge B2 connects the two adjacent second touch electrodes TE2 through the first and second contact holes CTH1 and CTH2.

In the present embodiment, a plurality of openings HL1 may be defined in the touch electrode portion TE. More specifically, the plurality of openings HL1 may be defined in the plurality of first touch electrodes TE1 and the plurality of second touch electrodes TE2 instead of being defined in the first bridge B1 and the second bridge B2 of the touch electrode portion TE.

In the present embodiment, each of the plurality of openings HL1 may be implemented in a partially disconnected form of the mesh-shaped structure of the touch electrode portion TE. For example, the plurality of openings HL1 may each be defined by disconnecting a portion extending in the first direction DR1 from the plurality of first touch electrodes TE1. Meanwhile, even though the plurality of opening HL1, each having the above-described structure, are defined in the plurality of first touch electrodes TE1, portions of the plurality of first touch electrodes TE1 adjacent to the plurality of openings HL1 are connected in a mesh structure such that inherent touch sensing functions of the plurality of first touch electrodes TE1 may be maintained.

Hereinafter, the reason why the plurality of openings HL1 are formed in the touch electrode portion TE will be described with reference to FIGS. 3 and 4.

Figure 3:
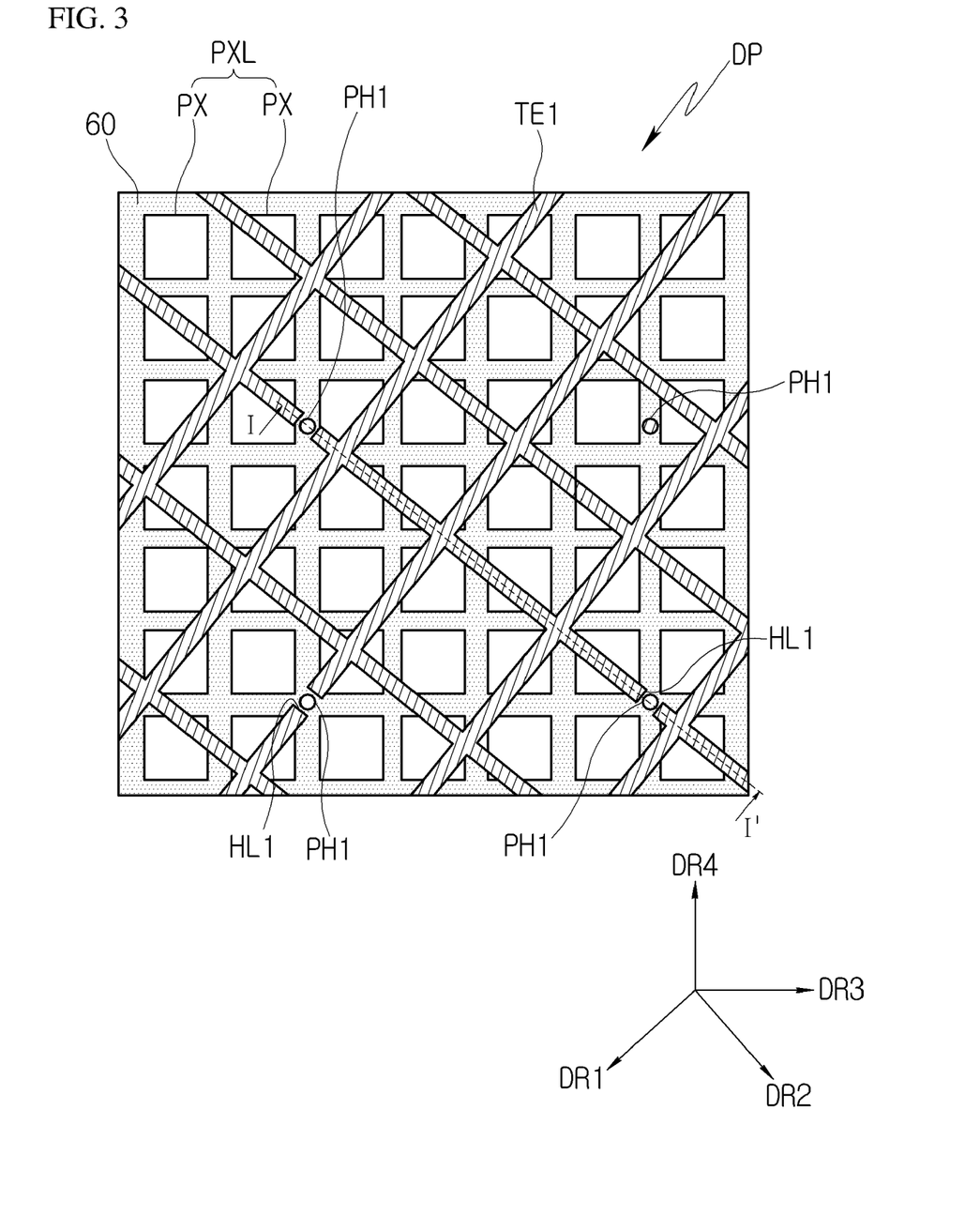
FIG. 3 is a plan view illustrating some pixels of a display panel corresponding to a sensing area of the display device with a built-in optical image sensor shown in FIG. 1, and the touch sensing layer overlapping the pixels.

FIG. 3 is a plan view illustrating some pixels of a display panel corresponding to a sensing area of the display device with a built-in optical image sensor shown in FIG. 1 and the touch sensing layer overlapping the pixels, and FIG. 4 is a cross-sectional view taken along line I-I' of FIG. 3.

Referring to FIGS. 3 and 4, in the present embodiment, the display panel DP may be an organic electroluminescent display panel and may include the pixel portion PXL composed of the plurality of pixels PX.

The touch sensing layer TS of FIG. 1 is deposited on the pixel portion PXL. Thus, as shown in FIG. 3, the mesh structure implemented with the portion of the first touch electrode TE1 of the touch sensing layer, which extends in the first direction DR1, and the portion of the second touch electrode thereof, which extends in the second direction DR2, overlaps the pixel portion PXL.

In the present embodiment, the pixel portion PXL may be defined as a structure which is disposed between the base substrate BS and the encapsulation film 90 to generate light which is used, by the display panel DP, to display an image thereon. Structures of other layers may be further added to the structure of the pixel portion PXL, which will be described below, as long as these structures cannot adversely affect to the technical gist of the present disclosure.

In this embodiment, the base substrate BS may be a plastic substrate such as a polyimide substrate. Alternatively, the base substrate BS may be a glass substrate.

The light shielding layer LS is disposed on the base substrate BS, and a first insulating film 10 is disposed on the light shielding layer LS. The light shielding layer LS is interposed between the base substrate BS and a driving transistor TR. The light shielding layer LS blocks light traveling to the driving transistor TR. Consequently, a switching characteristic of the driving transistor TR may be prevented from being varied due to light which is incident on an active pattern AP of the driving transistor TR by the light shielding layer LS.

In the present embodiment, a material constituting the light shielding layer LS may include a metal material, thereby having a characteristic of light reflectivity. Alternatively, the material constituting the light shielding layer LS may include a resin mixed with carbon, thereby having a characteristic of light absorptivity.

The driving transistor TR is disposed on the first insulating film 10. The driving transistor TR may be electrically connected to a switching transistor (not shown). The driving transistor TR may be turned on according to a switching operation of the switching transistor. Further, the driving transistor TR may be electrically connected to an organic light emitting diode including an anode E1, an organic light emitting layer EML, and a cathode CE to switch an operation of the organic light emitting diode.

In the present embodiment, the driving transistor TR includes the active pattern AP, a gate electrode GE, a source electrode SE, and a drain electrode DE. In the present embodiment, the driving transistor TR may have a top-gate structure.

The active pattern AP is disposed on the first insulating film 10, and a material constituting the active pattern AP includes a semiconductor material. In the present embodiment, the material constituting the active pattern AP may include polycrystalline silicon. However, the present disclosure is not limited to the above-described materials of the active pattern AP. For example, in another embodiment, the material constituting the active pattern AP may include an oxide semiconductor such as IGZO, ZnO, $SnO_2$, $In_2O_3$, $Zn_2SnO_4$, $Ge_2O_3$, or $HfO_2$. Alternatively, the material constituting the active pattern AP may include a compound semiconductor such as GsAs, GaP, or InP.

The second insulating film 20 covers the active pattern AP, and the gate electrode GE is disposed on a second insulating film 20 to overlap the active pattern AP. The second insulating film 20 is interposed between the gate electrode GE and the active pattern AP to serve as a gate insulating film.

A third insulating film 30 covers the gate electrode GE. In the present embodiment, the third insulating film 30 may be an organic film. The third insulating film 30 may flatten a step formed due to the active pattern AP and the gate electrode GE.

The source electrode SE is brought into contact with a source region of the active pattern AP through a contact hole defined in the third insulating film 30. Further, the drain electrode DE is spaced apart from the source electrode SE. The drain electrode DE is brought into contact with a drain region of the active pattern AP through another contact hole defined in the third insulating film 30.

A fourth insulating film 40 and a fifth insulating film 50 are sequentially stacked on the source electrode SE and the drain electrode DE to cover the source electrode SE and the drain electrode DE. Further, a contact hole is formed in each of the fourth insulating film 40 and the fifth insulating film 50 to correspond to a position of the drain electrode DE. The organic light emitting diode is electrically connected to the drain electrode DE through the contact holes formed in fourth insulating film 40 and the fifth insulating film 50.

The organic light emitting diode includes the anode E1, the organic light emitting layer EML, and the cathode CE. The anode E1 is brought into contact with the drain electrode DE, the organic light emitting layer EML is disposed on the anode E1, and the cathode CE is disposed on the organic light emitting layer EML.

The anode E1 is brought into contact with the drain electrode DE through the contact holes formed in the fourth insulating film 40 and the fifth insulating film 50. In the present embodiment, the anode E1 may be a reflective type electrode, and a material constituting the anode E1 may include a metal material such as aluminum.

The organic light emitting layer EML may be brought into contact with the anode E1 through an opening formed in a bank layer 60 disposed on the fifth insulating film 50. In the present embodiment, the organic light emitting layer EML may emit color light. Alternatively, the organic light emitting layer EML may emit white light. In this case, a color filter overlapping the organic light emitting layer EML may be disposed.

The cathode CE is disposed on the organic light emitting layer EML. In the present embodiment, the cathode CE may be a transmissive electrode or a semi-transmissive electrode, and a material constituting the cathode CE may include a transparent conductive material such as indium tin oxide (ITO), indium zinc oxide (IZO), zinc oxide (ZnO), or indium tin zinc oxide (ITZO). Consequently, light which reaches the anode E1 among lights emitted from the organic light emitting layer EML is reflected from the anode E1 and then emitted to the outside of the display panel DP1 through the cathode CE such that the display panel DP may display an image in a top emission manner.

The bank layer 60 is disposed between two adjacent pixels PX among the plurality of pixels PX. Further, the bank layer 60 has an open portion corresponding to a position of each of the plurality of pixels PX. Consequently, the organic light emitting layer EML may be accommodated in the open portion of the bank layer 60 to be disposed on the anode E1. The organic light emitting layer EML may be brought into contact with the anode E1.

In the present embodiment, a material constituting the bank layer 60 includes a resin mixed with carbon or a black pigment, thereby having light absorptivity. Thus, the bank layer 60 may serve as a light absorbing layer, which prevents lights emitted from two adjacent pixels PX from being mixed, in the pixel portion PXL.

In the present embodiment, a plurality of pinholes PH1 are formed in the bank layer 60. Each of the plurality of pinholes PH1 has a shape passing through upper and lower portions of the bank layer 60 in a thickness direction of the base substrate BS. Therefore, as described above, even though the material constituting the bank layer 60 includes a material which absorbs light, the bank layer 60 allows light to pass therethrough via the plurality of pinholes PH1. That is, the plurality of pinholes PH1 of the bank layer 60 may serve as pinhole lenses.

A sub-encapsulation film 80 and the encapsulation film 90 may be disposed on the cathode CE. In the present embodiment, the sub-encapsulation film 80 may be an inorganic film, and the encapsulation film 90 may be an organic film having a thickness that is greater than that of the sub-encapsulation film 80. The sub-encapsulation film 80 and the encapsulation film 90 may each block moisture and gas which may flow into the organic light emitting layer EML such that the organic light emitting layer EML may be prevented from being degraded due to the moisture and the gas.

The first touch electrode TE1 of the touch sensing layer TS of FIG. 1 is disposed on the encapsulation film 90. Further, the interlayer insulating film SL may be disposed on the first touch electrode TE1, and the second bridge B2 of FIG. 2 may be disposed on the interlayer insulating film SL.

A transparent adhesive film 310 is provided on the display panel DP, and the cover substrate 300 is disposed on the transparent adhesive film 310. Consequently, the cover substrate 300 may be adhered to the display panel DP by the transparent adhesive film 310.

In the present embodiment, the plurality of openings HL1 may be defined in the first touch electrode TE1 to correspond to and overlap the plurality of pinholes PH1 in a one-to-one correspondence relationship. Therefore, the light which is emitted from the organic light emitting layer EML and then reflected from a fingerprint FR of the user in contact with the cover substrate 300 may be incident on the optical image sensor 200 after sequentially passing through the plurality of openings HL1 and the plurality of pinholes PH1.

More specifically, in the top emission type display panel DP, the light which is emitted from the organic light emitting layer EML with a predetermined directivity angle passes through the cover substrate 300 to be emitted to the outside of the display device 500. In this case, when the fingerprint FR of the user is brought into contact with the sensing area SA of FIG. 1 of the cover substrate 300, ridge portions FR1-1 and FR1-2 of the fingerprint FR may be brought into contact with the cover substrate 300, and the light emitted from the organic light emitting layer EML may be reflected from the ridge portions FR1-1 and FR1-2 thereof. Unlike the ridge portions FR1-1 and FR1-2, a valley portion FR2 is not brought into contact with the cover substrate 300 such that the light emitted from the organic light emitting layer EML may be scattered in the valley portion FR2.

For example, among lights emitted from the organic light emitting layer EML and then reflected from the first ridge portion FR1, when light which is incident on the optical image sensor 200 substantially parallel to a normal direction of the optical image sensor 200 is defined as a first reflected light LT1, since the plurality of openings HL1 overlap the plurality of pinholes PH1 in a one-to-one correspondence relationship in a vertical direction of the base substrate BS when viewed in cross section, the first reflected light LT1 may be incident on the optical image sensor 200 after sequentially passing through an opening HL1 and a pinhole PH1 overlapping the opening HL1. Consequently, the optical image sensor 200 may sense an image of a first ridge portion FR1-1 using the first reflected light LT1 being incident on the optical image sensor 200.

Further, when the light which is emitted from the organic light emitting layer EML, is reflected from the valley portion FR2, and then is randomly scattered to be inclined with respect to the normal direction of the optical image sensor 200 is defined as a second reflected light LT2, since a traveling direction of the second reflected light LT2 is different from that of the first reflected light LT1, the second reflected light LT2 does not sequentially pass through the opening HL1 and the pinhole PH1 which overlap with each other.

Consequently, when the first reflected light LT1 is incident on any imaging element of the optical image sensor 200 and then a unit image of the first ridge portion FR1-1 is generated by the imaging element, incidence of the second reflected light LT2 not relating to the first ridge portion FR1-1 on the imaging element is minimized such that sharpness of the unit image may be improved.

Meanwhile, as shown in FIG. 3, in the present embodiment, the plurality of pinholes PH1 may be arranged in the form of a matrix having a row direction of a third direction DR3 and a column direction of a fourth direction DR4, and the plurality of openings HL1 may be disposed in the form of a matrix having a row direction of the third direction DR3 and a column direction of the fourth direction DR4.

As described above, one unit image of the fingerprint FR is generated using a structure of a single pinhole PH1 and an opening HL1 overlapping the single pinhole PH1. Consequently, when the plurality of pinholes PH1 are disposed in the matrix form, a plurality of unit images may also be generated in the matrix form by the imaging elements of the optical image sensor 200.

In the present embodiment, the plurality of unit images with image information of the fingerprint FR may be converted into a single image representing the entire fingerprint FR. In this case, as described above, since a quantity of the second reflected light LT2 incident on the optical image sensor 200 is minimized during the generation of the plurality of unit images, the sharpness of the single image representing the entire fingerprint FR may be improved.

Meanwhile, in the present embodiment, in order to generate the image of the fingerprint FR in the optical image sensor 200, the plurality of pinholes PH1 may be disposed in a matrix form. However, since any one among the plurality of pinholes PH1 may not overlap any one among the plurality of openings HL1, unlike the plurality of pinholes PH1, the plurality of openings HL1 may not be disposed in the matrix form. However, each of the plurality of openings HL1 may overlap any one among the plurality of pinholes PH1.

Figure 5:
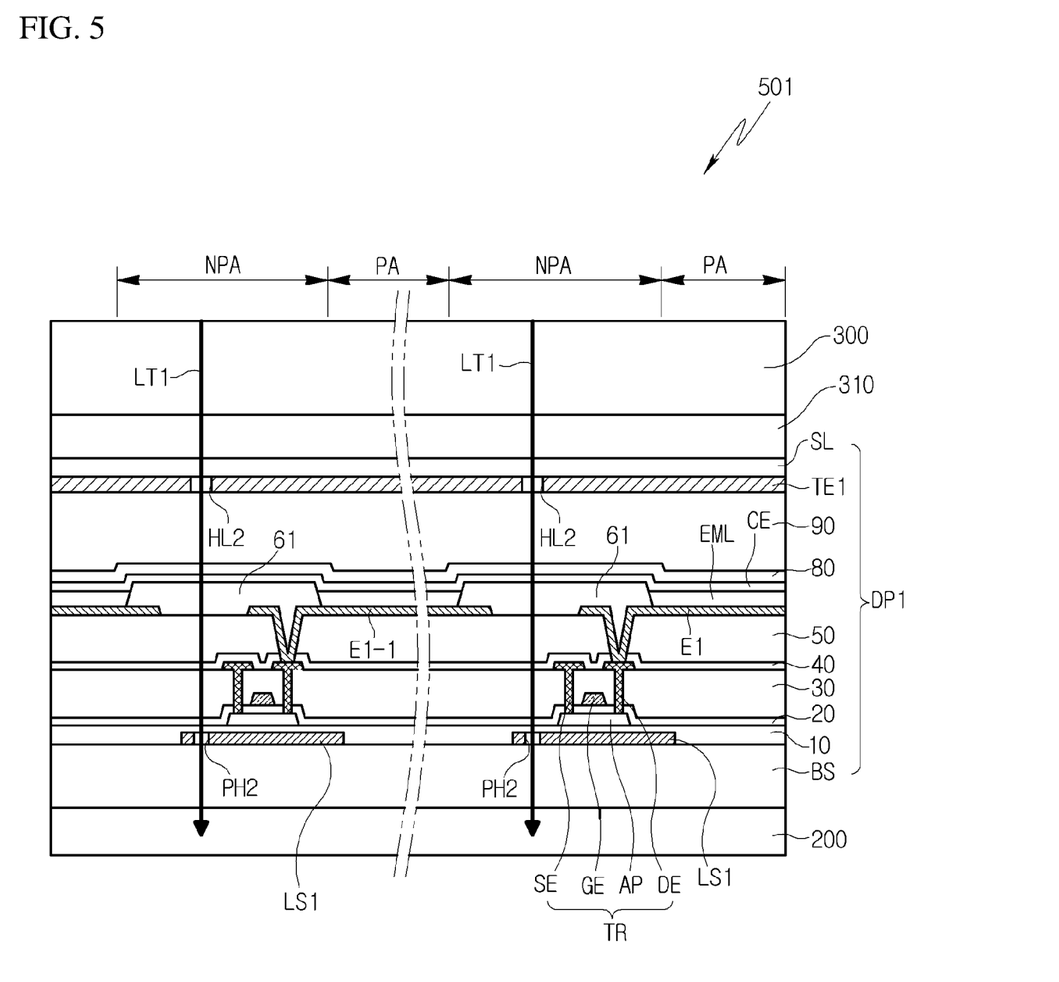
FIG. 5 is a cross-sectional view of a display device with a built-in optical image sensor according to another embodiment of the present disclosure.

FIG. 5 is a cross-sectional view of a display device 501 with a built-in optical image sensor according to another embodiment of the present disclosure. A position of a cross section of the display device 501 with a built-in optical image sensor (hereinafter, referred to as the "display device 501") shown in FIG. 5 may be the same as that of the cross section of the display device 500 shown in FIG. 4. Further, in a description of FIG. 5, the same reference numerals are assigned to the same components described in the above embodiments, and an overlapping description thereof will be omitted.

Referring to FIG. 5, the display device 501 includes a display panel DP1. The display panel DP1 includes a pixel portion composed of the plurality of pixels PX of FIG. 1 disposed in a plurality of pixel areas PA. Each of the plurality of pixels PX may include the driving transistor TR, the anode E1, the organic light emitting layer EML, and the cathode CE. Further, a non-pixel area NPA is defined between two adjacent pixel areas PA, and a bank layer 61 is disposed in the non-pixel area NPA.

Unlike the bank layer 60 of FIG. 4 which has the light absorptivity and is described with reference to FIG. 4, the bank layer 61 in the embodiment shown in FIG. 5 may have light transmissivity. In the present embodiment, a material constituting the bank layer 61 may include a transparent resin.

As described above, each of a plurality of light shielding layers LS1 blocks light incident on the driving transistor TR and is a layer having a characteristic of light reflectivity in the pixel portion PXL.

In the above-described embodiment shown in FIG. 4, the plurality of pinholes PH1 of FIG. 4 are defined in the bank layer 60 of FIG. 4, whereas, in the embodiment shown in FIG. 5, a plurality of pinholes PH2 are defined in the plurality of light shielding layers LS1 instead of the bank layer 61.

As shown in FIG. 5, in the present embodiment, when the plurality of pinholes PH2 are defined in the plurality of light shielding layers LS1 in a one-to-one correspondence relationship, the plurality of pinholes PH2 may be defined in portions corresponding to the non-pixel areas NPA of the plurality of light shielding layers LS1.

Further, a plurality of openings HL2 are defined in the first touch electrode TE1 having a mesh structure. The plurality of openings HL2 overlap the plurality of pinholes PH2 in a one-to-one correspondence relationship. Therefore, as in the embodiment described with reference to FIG. 4, an optical path through which the first reflected light LT1 reflected from the ridge portion of the fingerprint of the user is incident on the optical image sensor 200 may be secured, and a quantity of light incident on the optical image sensor 200 is also minimized due to scattering in the fingerprint of the user in addition to the first reflected light LT1 such that the sharpness of the image of the fingerprint generated by the optical image sensor 200 may be improved.

Figure 6:
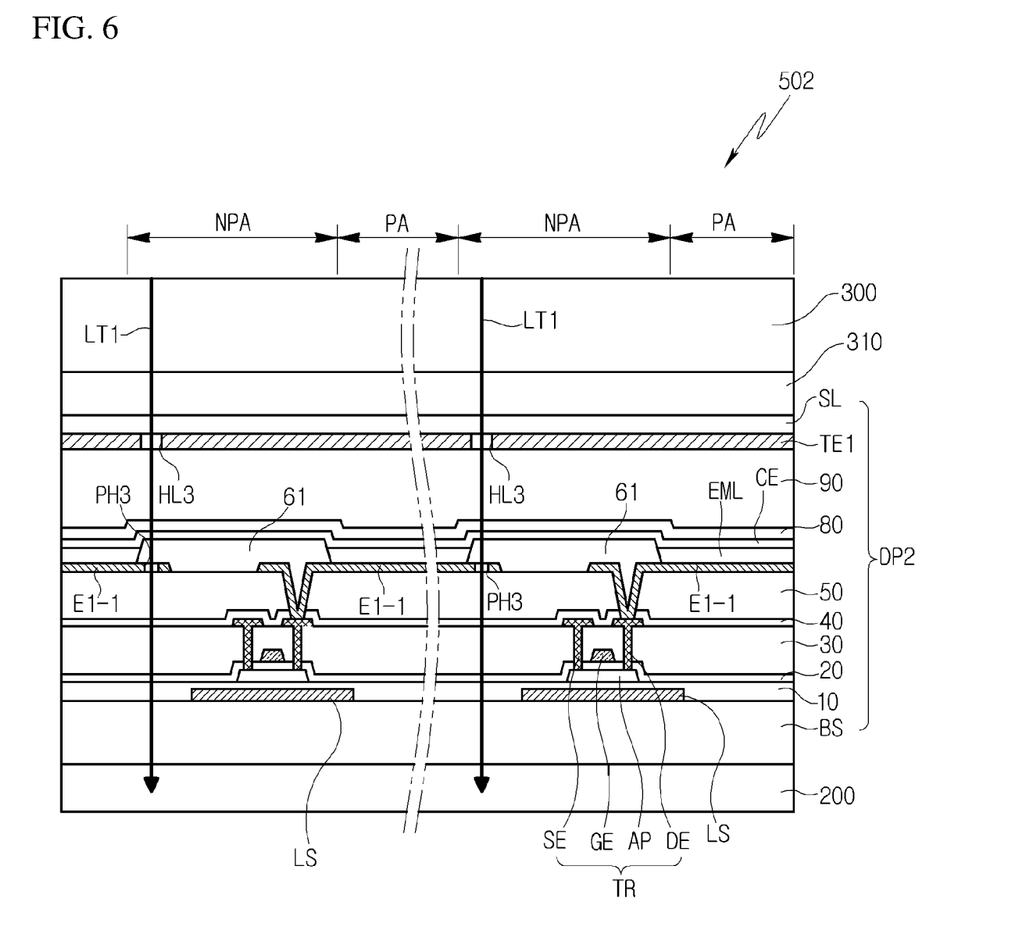
FIG. 6 is a cross-sectional view of a display device with a built-in optical image sensor according to another embodiment of the present disclosure.

FIG. 6 is a cross-sectional view of a display device 502 with a built-in optical image sensor according to still another embodiment of the present disclosure. A position of a cross section of the display device 502 with a built-in optical image sensor (hereinafter, referred to as the "display device 502") shown in FIG. 6 may be the same as that of the cross section of the display device 500 shown in FIG. 4. Further, in a description of FIG. 6, the same reference numerals are assigned to the same components described in the above embodiments, and an overlapping description thereof will be omitted.

Referring to FIG. 6, the display device 502 includes a display panel DP2. The display panel DP2 includes a pixel portion composed of the plurality of pixels PX of FIG. 1 disposed in a plurality of pixel areas PA. Each of the plurality of pixels PX may include the driving transistor TR, the anode E1-1, the organic light emitting layer EML, and the cathode CE. Further, a non-pixel area NPA is defined between two adjacent pixel areas PA, and a bank layer 61 is disposed in the non-pixel area NPA.

Like the bank layer 61 described with reference to FIG. 5, the bank layer 61 in the embodiment shown in FIG. 6 may have light transmissivity. Further, in the present embodiment, the display panel DP2 may be a front emission type organic electroluminescent display panel, and thus an anode E1-1 in the pixel portion is a layer having a characteristic of light reflectivity.

As described above, in the embodiment shown in FIG. 4, the plurality of pinholes PH1 of FIG. 4 are defined in the bank layer 60 of FIG. 4, whereas, in the embodiment shown in FIG. 5, the plurality of pinholes PH2 of FIG. 5 are defined in the plurality of light shielding layers LS1 of FIG. 5. On the other hand, in the embodiment shown in FIG. 6, a plurality of pinholes PH3 are defined in a plurality of anodes E1-1.

As shown in FIG. 6, when the plurality of pinholes PH3 are defined in the plurality of anodes E1-1 in a one-to-one correspondence relationship, in the present embodiment, the plurality of pinholes PH3 may be defined in portions corresponding to non-pixel areas NPA of the plurality of anodes E1-1. Therefore, even though the plurality of pinholes PH3 are formed in the plurality of anodes E1-1, it is possible to prevent degradation of emission performance of the organic light emitting layer EML.

Further, a plurality of openings HL3 are defined in the first touch electrode TE1 having a mesh structure. The plurality of openings HL3 overlap the plurality of pinholes PH3 in a one-to-one correspondence relationship. Therefore, as in the embodiment described with reference to FIG. 4, an optical path through which the first reflected light LT1 reflected from the ridge portion of the fingerprint of the user is incident on the optical image sensor 200 may be secured, and a quantity of light incident on the optical image sensor 200 is also minimized due to scattering in the fingerprint of the user in addition to the first reflected light LT1 such that the sharpness of the image of the fingerprint generated by the optical image sensor 200 may be improved.

According to the embodiments of the present disclosure, an opening is formed in a touch electrode of a touch sensing layer which is built in a display panel. The opening overlaps a pinhole serving as a pinhole lens in a layer having light absorptivity or light reflectivity of a pixel portion. Accordingly, light reflected from a fingerprint can be incident on an optical image sensor coupled to a rear surface of a display panel through the opening and the pinhole. That is, the opening is formed in the touch electrode such that an optical path through which the light reflected from the fingerprint is incident on the optical image sensor can be easily secured.

Although the description has been made with reference to the embodiments of the present disclosure, it should be understood that various alternations and modifications of the present disclosure can be devised by those skilled in the art to which the present disclosure pertains without departing from the spirit and scope of the present disclosure, which are defined by the appended claims.

What is claimed is:

1. A display device with a built-in optical image sensor, comprising:
   a display panel;
   a cover substrate having light transmissivity and configured to cover the display panel; and
   the optical image sensor coupled to the display panel and configured to sense an image of a body of a user using light reflected from the body of the user in contact with the cover substrate,
   wherein the display panel includes:
   a base substrate;
   a pixel portion disposed on the base substrate;
   an encapsulation film configured to cover the pixel portion; and
   a touch sensing layer including a touch electrode portion and disposed on the encapsulation film to be located between the encapsulation film and the cover substrate, and
   wherein a plurality of pinholes are defined in at least one layer of the pixel portion having light absorptivity or light reflectivity, the plurality of pinholes overlapping the optical image sensor, and wherein a plurality of openings overlapping the plurality of pinholes are defined in the touch electrode portion.

2. The display device of claim 1, wherein the pixel portion includes:
   a plurality of pixels disposed on the base substrate; and
   a bank layer located between two adjacent pixels,
   wherein the bank layer has the light absorptivity and the plurality of pinholes are defined in the bank layer.

3. The display device of claim 2, wherein each of the plurality of pinholes passes through the bank layer in a thickness direction of the base substrate.

4. The display device of claim 1, wherein:
the pixel portion includes a plurality of pixels disposed on the base substrate;
each of the plurality of pixels includes:
- a driving transistor disposed on the base substrate;
- an anode electrically connected to the driving transistor;
- an organic light emitting layer disposed on the anode;
- a cathode disposed on the organic light emitting layer; and
- a light shielding layer interposed between the base substrate and the driving transistor and configured to block light traveling toward the driving transistor, wherein at least one of the plurality of pinholes is defined in the light shielding layer.

5. The display device of claim 4, wherein:
the plurality of pixels are disposed in a plurality of pixel areas;
a non-pixel area is defined between two adjacent pixel areas among the plurality of pixel areas; and
the plurality of pinholes are defined in the light shielding layer at positions corresponding to the non-pixel area.

6. The display device of claim 4, wherein:
the pixel portion includes a bank layer located between two adjacent pixels among the plurality of pixels; and
the bank layer has light transmissivity.

7. The display device of claim 1, wherein:
the pixel portion includes a plurality of pixels disposed on the base substrate;
each of the plurality of pixels includes:
- a driving transistor disposed on the base substrate;
- an anode having light reflectivity and electrically coupled to the driving transistor;
- an organic light emitting layer disposed on the anode; and
- a cathode disposed on the organic light emitting layer, and
at least one of the plurality of pinholes is defined in the anode.

8. The display device of claim 7, wherein:
the plurality of pixels are disposed in a plurality of pixel areas;
a non-pixel area is defined between two adjacent pixel areas among the plurality of pixel areas; and
the at least one of the plurality of pinholes is defined in the anode at a position corresponding to the non-pixel area.

9. The display device of claim 7, wherein:
the pixel portion includes a bank layer located between two adjacent pixels among the plurality of pixels; and
the bank layer has light transmissivity.

10. The display device of claim 1, wherein the touch electrode portion includes:
a touch electrode; and
a bridge configured to connect the touch electrode to another touch electrode adjacent to the touch electrode, wherein
the plurality of openings are defined in the touch electrode.

11. The display device of claim 10, wherein the touch electrode has a characteristic of light reflectivity.

12. The display device of claim 1, wherein:
the touch electrode portion includes a touch electrode with a mesh structure; and
each of the plurality of openings is defined as a shape in which a portion of the touch electrode is disconnected.

13. The display device of claim 1, wherein the optical image sensor is opposite to the pixel portion by interposing the base substrate therebetween.

14. The display device of claim 1, wherein the plurality of pinholes are arranged in a form of a matrix having a row direction and a column direction.

15. The display device of claim 1, wherein the touch sensing layer is disposed on the encapsulation film, the touch sensing layer in contact with the encapsulation film.

16. The display device of claim 1, wherein each of the plurality of openings overlaps one of the plurality of pinholes.

* * * * *